US011948965B2

(12) United States Patent
Zang et al.

(10) Patent No.: US 11,948,965 B2
(45) Date of Patent: Apr. 2, 2024

(54) UNEVEN-TRENCH PIXEL CELL AND FABRICATION METHOD

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 303 days.

(21) Appl. No.: 17/220,695

(22) Filed: Apr. 1, 2021

(65) Prior Publication Data

US 2022/0320175 A1    Oct. 6, 2022

(51) Int. Cl.
*H01L 27/146* (2006.01)
*H01L 27/148* (2006.01)
*H01L 29/423* (2006.01)

(52) U.S. Cl.
CPC .. *H01L 27/14643* (2013.01); *H01L 27/14683* (2013.01); *H01L 27/14831* (2013.01); *H01L 27/14887* (2013.01); *H01L 29/4236* (2013.01)

(58) Field of Classification Search
CPC ............ H01L 27/14887; H01L 27/146–14893
See application file for complete search history.

(56) References Cited

U.S. PATENT DOCUMENTS

| | | | | |
|---|---|---|---|---|
| 11,616,088 | B2 * | 3/2023 | Hu .................... | H01L 27/14643 257/292 |
| 2010/0117126 | A1 * | 5/2010 | Takahashi .......... | H01L 27/1463 257/292 |
| 2010/0134667 | A1 * | 6/2010 | Suzuki .................... | H04N 25/63 348/294 |
| 2010/0161273 | A1 * | 6/2010 | Mansfield .......... | G01B 9/02089 29/829 |
| 2015/0372034 | A1 * | 12/2015 | Chen ................. | H01L 27/14614 257/334 |
| 2016/0049429 | A1 * | 2/2016 | Lee .................... | H01L 27/14612 257/231 |
| 2016/0056199 | A1 * | 2/2016 | Kim ...................... | H04N 25/771 257/233 |
| 2016/0268404 | A1 * | 9/2016 | Hu .................... | H01L 29/66348 |
| 2020/0135781 | A1 | 4/2020 | Nakagawa | |
| 2021/0098606 | A1 * | 4/2021 | Bian ....................... | H01L 21/28 |

* cited by examiner

*Primary Examiner* — Ajay Ojha
*Assistant Examiner* — David Paul Sedorook
(74) *Attorney, Agent, or Firm* — COZEN O'CONNOR

(57) ABSTRACT

An uneven-trench pixel cell includes a semiconductor substrate that includes a floating diffusion region, a photodiode region, and, between a front surface and a back surface: a first sidewall surface, a shallow bottom surface, a second sidewall surface, and a deep bottom surface. The first sidewall surface and a shallow bottom surface define a shallow trench, located between the floating diffusion region and the photodiode region, that extends into the semiconductor substrate from the front surface. A shallow depth of the shallow trench exceeds a junction depth of the floating diffusion region. The second sidewall surface and a deep bottom surface define a deep trench, located between the floating diffusion region and the photodiode region, that extends into the semiconductor substrate from the front surface. A distance between the deep bottom surface and the front surface defines a deep depth, of the deep trench, that exceeds the shallow depth.

25 Claims, 12 Drawing Sheets

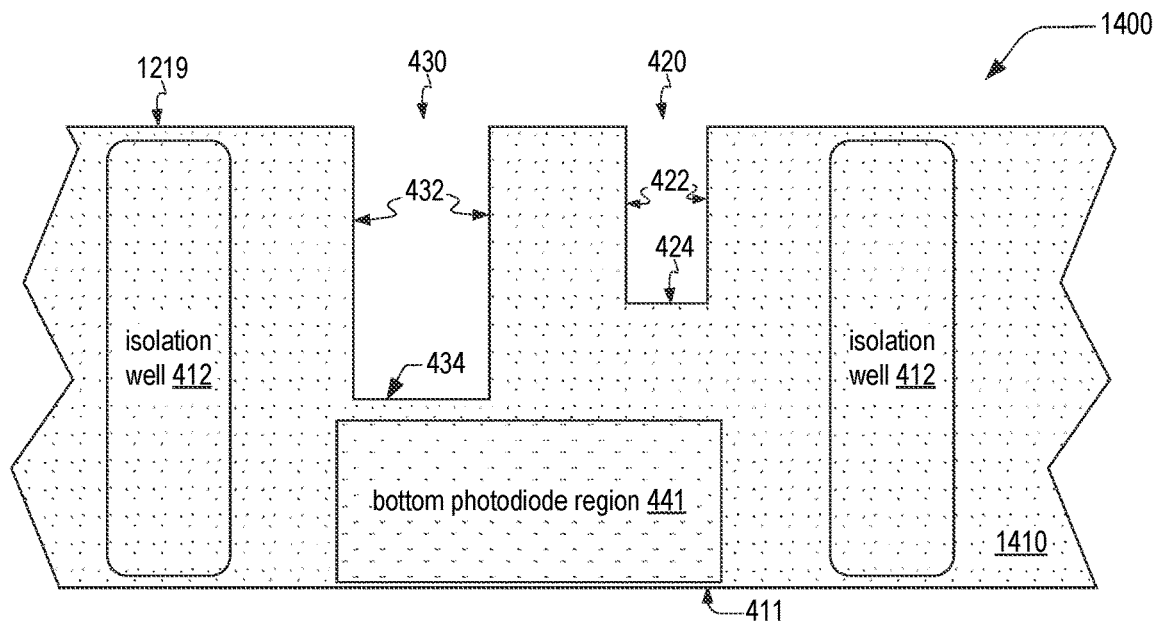

1510
Simultaneously etch (i) a first region of a substrate exposed by a small aperture of an apertured mask located on a surface of the substrate, and (ii) a second region of the substrate exposed by a large aperture of the apertured mask, in a direction parallel to the surface, a width of the large aperture in a first direction exceeding a width of the small aperture in the first direction.

1512
Etch the first region and the second region with a same exposure dose.

1520
Line the shallow trench, the deep trench, and an inter-trench region of the surface therebetween with a dielectric layer.

1530
Fill the shallow trench and the deep trench with a conductive material that spans between the shallow trench and the deep trench via the inter-trench region

1540
Form a single photodiode region located beneath each of the deep trench and the shallow trench.

1550
Form a p-doped isolation well surrounding the single photodiode region.

FIG. 15

UNEVEN-TRENCH PIXEL CELL AND FABRICATION METHOD

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed as a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode, a floating diffusion region, and a transfer gate formed in a pixel-array substrate, which is part of the image sensor. The transfer gate controls electron flow from the photodiode to the floating diffusion region and may be part of a field-effect transistor. Light reaching the photodiode generates photoelectrons. Turning on the transfer gate forms a conducting channel that allows the accumulated photoelectrons to transfer or flow from the photodiode to the floating diffusion region. When the transfer gate is pulsed to an off-state, the associated potential is lower than that of the photodiode raising a barrier in the corresponding energy band diagram to block electron flow from photodiode to floating diffusion region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally oriented with respect to the vertical direction perpendicular thereto that defines the direction of normally-incident light (illumination) reaching the pixel array. Such a horizontal orientation limits how much the pixel density can be increased. Hence, one way to increase pixel density is to orient the photodiode, transfer gate, and floating diffusion region in a direction that has a vertical component. Such transfer gates are examples of vertical transfer gates.

SUMMARY OF THE EMBODIMENTS

In some imaging scenarios, blooming artifacts degrade the quality of images captured by image sensors that include vertical transfer gates. Blooming is a type of optical crosstalk that occurs when, in response to light incident on a pixel, the quantity of photoelectrons accumulated in a pixel's photodiode exceeds the pixel's saturation level (full well capacity), such that excess photoelectrons are detected by one or more adjacent pixels. Embodiments disclosed herein remedy this problem by introducing a blooming path, which is a leakage path that enables excess photoelectrons, generated in a pixel's photodiode, to travel from the photodiode to the pixels' floating diffusion region during integration (or exposure) period where the pixel's transfer gate is turned off (e.g., negative biased). The pixel hence detects said excess photoelectrons such that the photoelectrons do not produce blooming artifacts.

In a first aspect, an uneven-trench pixel cell includes a semiconductor substrate that includes a floating diffusion region, a photodiode region, and, between a front surface and a back surface opposing the front surface of the semiconductor substrate: a first sidewall surface, a shallow bottom surface, a second sidewall surface, and a deep bottom surface. The first sidewall surface and a shallow bottom surface define a shallow trench, located between the floating diffusion region and the photodiode region, that extends into the semiconductor substrate from the front surface. A distance between the shallow bottom surface and the front surface defines a shallow depth of the shallow trench. The shallow depth exceeds a junction depth of the floating diffusion region. The second sidewall surface and a deep bottom surface define a deep trench, located between the floating diffusion region and the photodiode region, that extends into the semiconductor substrate from the front surface. A distance between the deep bottom surface and the front surface defines a deep depth, of the deep trench, that exceeds the shallow depth.

In a second aspect, a pixel cell includes a semiconductor substrate and a transfer gate. The semiconductor substrate includes a floating diffusion region, a photodiode region, and a front surface. The transfer gate is disposed on the semiconductor substrate, couples the photodiode region to the floating diffusion region, and includes: a first vertical gate electrode extending to a first depth from the front surface into the semiconductor substrate; and a second vertical gate electrode extending a second depth from the front surface into the semiconductor substrate. The second depth exceeds the first depth. The first depth exceeds a junction depth of the floating diffusion region.

In a third aspect, a method for fabricating a pixel cell includes simultaneously etching (i) a first region of a substrate exposed by a small aperture of an apertured mask located on a surface of the substrate, and (ii) a second region of the substrate exposed by a large aperture of the apertured mask. In a direction parallel to the surface, a width of the large aperture in a first direction exceeds a width of the small aperture in the first direction.

BRIEF DESCRIPTION OF THE FIGURES

FIG. 14 is a schematic cross-sectional view of a pixel cell resulting from processing of the masked substrate of FIG. 13, in an embodiment.

FIG. 15 is a flowchart illustrating a method for fabricating a pixel cell of FIG. 4, in an embodiment.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 1:
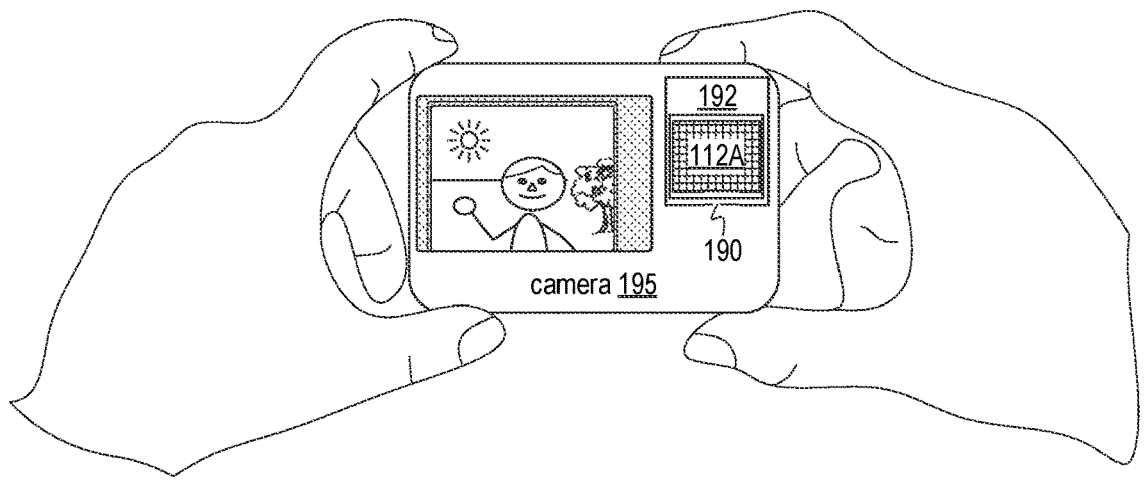
FIG. 1 depicts a camera imaging a scene.

FIG. 1 depicts a camera 195 imaging a scene. Camera 195 includes an image sensor 192, which includes a pixel-array substrate 190. Constituent elements of pixel-array substrate 190 may include at least one of silicon and germanium. Pixel-array substrate 190 includes a pixel array 112A. Image sensor 192 may part of a chip-scale package or a chip-on-board package. Camera 195 is shown as a component of a handheld device, but it should be appreciated that other devices, such as security devices, automobile cameras, drone cameras, etc. may utilize camera 195 without departing from the scope hereof.

Figure 2:
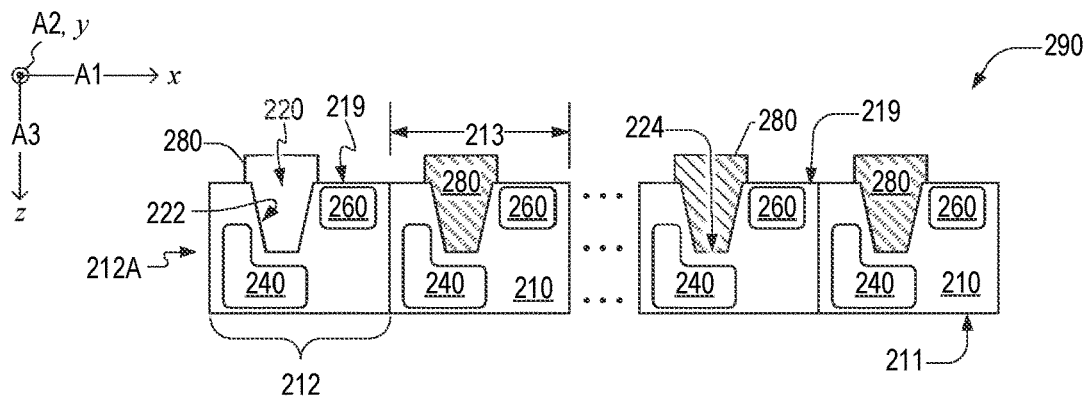
FIG. 2 is a cross-sectional schematic of a pixel-array substrate, which is an embodiment of a pixel-array substrate of the camera of FIG. 1.
Figure 4:
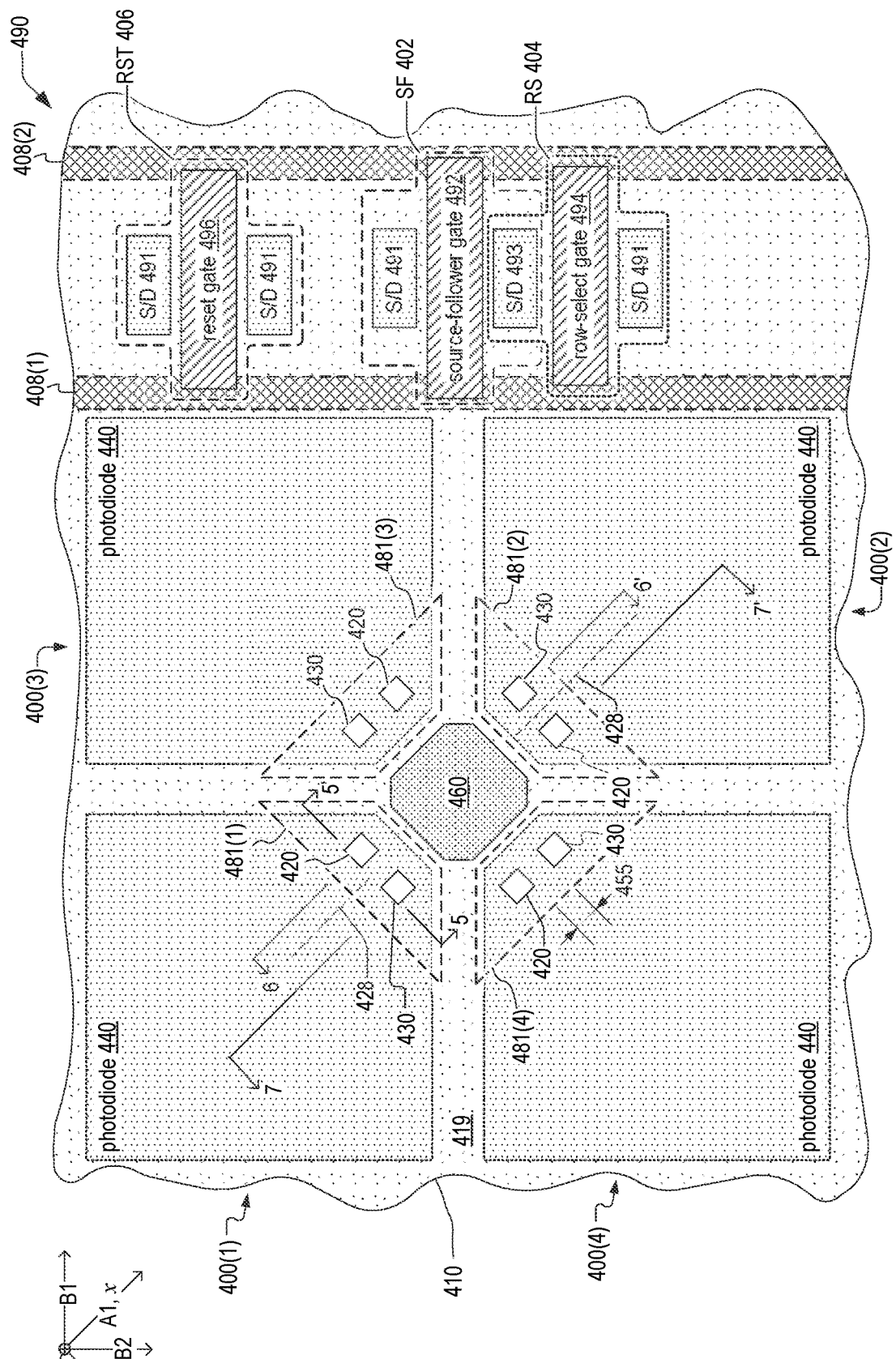
FIG. 4 is a schematic plan view of a pixel-array substrate that includes multiple pixel cells, the pixel-array substrate being an example of the pixel-array substrate of FIG. 2.

FIG. 2 is a cross-sectional schematic of a pixel-array substrate 290, which is an example of pixel-array substrate 190 of image sensor 192. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the x or y axis, and a vertical direction is along the z axis. FIG. 4 also denotes axes B1 and B2, which in embodiments are rotated by forty-five degrees with respect to axes A1 and A2, respectively, and denote respective directions of rows and columns of pixels forming a pixel array in semiconductor substrate 410.

Pixel-array substrate 290 includes a semiconductor substrate 210, which has a bottom substrate surface 211 and a front substrate surface 219, each of which may be perpendicular to direction A3. Herein, front substrate surface 219 may be referred to as the front side surface of semiconductor substrate 210 and bottom substrate surface 211 may be referred to as the backside surface of semiconductor substrate 210. Herein, front substrate surface 219 may be referred as the non-illuminated surface of semiconductor substrate 210 and bottom substrate surface 211 opposite to front substrate surface 219 may be referred to as the illuminated surface of semiconductor substrate 210.

Semiconductor substrate 210 includes a plurality of pixels 212 that form a pixel array 212A, which is an example of pixel array 112A. Pixels 212 are arranged in a plurality of rows and columns in directions A1 and A2 respectively. Pixel array 212A has a diagonal pixel pitch 213 in direction A1. In direction A2 pixel array 212A has pitch $P_y$, that, in embodiments, equals diagonal pixel pitch 213. In embodiments, diagonal pixel pitch 213 is less than 1.6 µm, for example, diagonal pixel pitch 213 may be between 1.0 µm to 3.0 µm, which corresponds to a range of standard pixel pitch between 0.7 µm to 2.0 µm.

Figure 3:
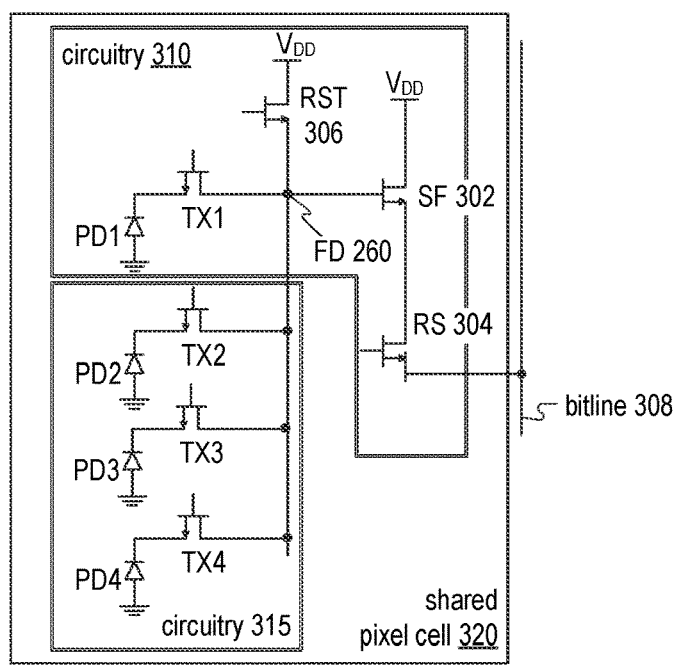
FIG. 3 is a circuit diagram of a shared pixel, which is a candidate pixel circuitry architecture of a pixel of FIG. 2.

FIG. 3 is a circuit diagram of a four-transistor ("4T") circuitry 310, which is a candidate pixel circuitry architecture of pixel 212. Circuitry 310 includes a photodiode PD1, a transfer transistor TX1, a reset transistor 306, a source-follower transistor 302, and a row-select transistor 304. Circuitry 310 is electrically connected to a bitline 308 of image sensor 192. FIGS. 2 and 3 are best viewed together in the following description.

In embodiments, each pixel 212 is one of multiple pixels of a shared pixel cell. FIG. 3 depicts a shared pixel-cell 320, which is candidate pixel circuitry architecture for the shared pixel cell. Shared pixel-cell 320 includes circuitry 310 and circuitry 315. Circuitry 315 includes additional respective photodiodes PD2-PD4 and transfer transistors TX2-TX4 of three additional pixels of the shared pixel-cell. Circuitry 315 and circuitry 310 represent pixel circuitry for a shared pixel-cell 320. Herein, transfer transistor TX refers to one of transfer transistors T1-T4.

Each pixel 212 includes a respective photodiode 240, a respective transfer transistor (e.g., transfer transistor TX) having vertical transfer gate 280, and a respective floating diffusion region 260.

Photodiode 240 of each pixel 212 is at least partially embedded in pixel-array substrate 290 and is configured to generate and accumulate charges in response to incident light (illumination) thereon, for example entered from bottom substrate surface 211 of semiconductor substrate 210 (e.g., backside surface of semiconductor substrate 210) during an integration period of the image sensor 192. Photodiode 240 is an example of any one of photodiodes PD1-PD4 of FIG. 3. In embodiments, photodiode 240 and floating diffusion region 260 are a source and a drain, respectively, of transfer transistor TX.

Electrical connection of photodiode 240 to floating diffusion region 260 depends on voltage applied to a transfer gate (e.g., vertical transfer gate 280) of the respective transfer transistor (e.g., transfer transistor TX) associated with pixel 212. Charges, e.g., photoelectrons, photo-generated and accumulated in photodiode 240 of respective pixel 212 can be selectively transferred to floating diffusion region 260 depending on voltage applied to the transfer gate (e.g., vertical transfer gate 280) of the respective transfer transistor associated with pixel 212, for example during a subsequent charge transfer period. Photodiode 240 may be in various configurations including, but not limited to, a pinned photodiode configuration and a partially pinned photodiode configuration. In embodiments, a pinning layer (e.g., P-type doped layer) is disposed between front surface of semiconductor substrate and photodiode region, wherein the pinning layer is coupled to a ground. In embodiments, charges accumulate in photodiode 240 during an integration period of image sensor 192.

A transfer gate (e.g., vertical transfer gate 280) of each transfer transistor (e.g., vertical gate electrode of transfer transistor TX1) is formed in a respective trench 220 defined by a side trench-surface 222 and a bottom trench-surface 224 of front substrate surface 219.

In embodiments, each pixel 212 is a pixel unit in a shared pixel cell and each pixel cell further includes reset transistor 306, source-follower transistor 302, and row-select transistor 304 shared by pixel 212 in the shared pixel cell. In FIG. 3, reset transistor 306, source-follower transistor 302, and row-select transistor 304 are abbreviated as RS 306, SF 302, and RST 304, respectively. Reset transistor 306 is coupled between a power line and floating diffusion region 260 to reset (e.g., discharge or charge floating diffusion region 260 to a preset voltage e.g., a supply voltage $V_{DD}$) under control of a reset signal during a reset period. Reset transistor 306 is further coupled to photodiode 240 (e.g., one of photodiodes PD1-PD4) through the respective transfer transistor TX (e.g., transfer transistor TX1-TX4) to reset respective photodiode 240 to the preset voltage during the reset period. Floating diffusion region 260 is coupled to a gate of source-follower transistor 302. Source-follower transistor 302 is coupled between the power line and row-select transistor 304. Source-follower transistor 302 operates to modulate an image signal based on the voltage of floating diffusion region 260, where the image signal corresponds to the amount photoelectrons accumulated in photodiode 240 of each pixel during the integration period at the gate thereof. Row-select transistor 304 selectively couples the output (e.g., image signal) of source-follower transistor 302 to the readout column line (for example, bitline 308) under control of a row select signal.

In operation, during the integration period (also referred to as an exposure or accumulation period) of image sensor 192, photodiode 240 detects or absorbs light incident on pixel 212 and photogenerates charge. During the integration period, each of the transfer transistors TX1-TX4 is turned off, i.e., vertical transfer gate 280 of the respective transfer transistor TX1-TX4 receives a cut-off signal (e.g., a negative biasing voltage). The photogenerated charge accumulated in photodiode 240 is indicative of the amount of light incident on photodiode 240. After the integration period, each of the transfer transistors TX1-TX4 is turned on forming a conduction channel along the vertical transfer gate structure and transfers the photogenerated charge from photodiode 240 to floating diffusion region 260 through the conduction channel upon reception of a transfer signal (e.g., a positive biasing voltage) at vertical transfer gate 280 of transfer transistors TX1-TX4. Source-follower transistor 302 generates the image signal. Row-select transistor 304 coupled to source-follower transistor 302 then selectively reads out the signal onto a column bit line 308 for subsequent image processing.

In embodiments, vertical transfer gate structures disclosed herein are part of a shared-type pixel cell where floating diffusion region 260 is shared by multiple photodiodes. Vertical transfer gate structures disclosed herein may apply to any of a variety of additional or alternative types of pixel cell, e.g. a four-transistor pixel cell, five-transistor pixel cell, or a six-transistor pixel cell.

FIG. 4 is a schematic plan view of a pixel-array substrate 490, which is an example of pixel-array substrate 290, FIG. 2. Pixel-array substrate 490 includes a semiconductor substrate 410 that includes photodiodes 440, and a floating diffusion region 460, which are examples of semiconductor substrate 210, photodiodes 240, and floating diffusion region 460, respectively. Semiconductor substrate 410 also includes at least one shallow trench 420 and at least one deep trench 430.

In embodiments, pixel-array substrate 490 also includes a source-follower transistor 402, which is an example of source-follower transistor 302. Source-follower transistor 402 includes source/drain regions 491, 493 disposed in pixel-array substrate 490 and a source-follower gate 492 on the pixel-array substrate 490 and coupled between source/drain regions 491, 493. The source-follower gate 492 is electrically coupled to floating diffusion region 460. Pixel-array substrate 490 may also include at least one of row-select transistor 404 and a reset transistor 406. Reset transistor 406 includes a pair of source/drain regions 491 disposed in pixel-array substrate 490 and a reset gate 496, which is disposed on the pixel-array substrate 490 and coupled between source/drain regions 491. One of the source/drain region 491 of reset transistor 406 is coupled to a power line and the other source/drain region 491 of reset transistor 406 is coupled to floating diffusion region 406. Row-select transistor 404 includes a source/drain region 491 and source/drain region 493 disposed in pixel-array substrate 490, and row-select gate 494, which is disposed on the pixel-array substrate 490 and coupled between source/drain regions 491, 493. Source/drain region 493 is part of both source-follower transistor 402 and row-select transistor 404 such that the drain of source-follower transistor 402 is the source of row-select transistor 404. Source/drain region 491 of row-select transistor 404 is coupled to a bitline. Row-select transistor 404 and reset transistors 406 are examples of row-select transistor 304 and reset transistors 306 of FIG. 3, respectively. In embodiments, pixel-array substrate 490 includes shallow-trench isolation (STI) structures 408(1) and 408(2), wherein at least part of each of transistors 402, 404, and 406 is between STI structures 408(1) and 408(2). Each STI structure 408 includes a dielectric material filling a trench formed in front surface 419 of semiconductor substrate 410. In embodiments, a gate width of source follower gate 492 along axis B1 is larger than a gate width of row-select gate 494 along axis B1. In embodiments, a gate length of source follower gate 492 along axis B2 is larger than a gate length of row-select gate 494 along axis B2. In embodiments, a gate width of source follower gate 492 along axis B1 is larger than a gate width of reset gate 496. In embodiments, a gate length of source follower gate 492 along axis B2 is larger than a gate length of reset gate 496 along axis B2. In embodiments, a gate area of source follower gate 492 is larger than a gate area of at least one of row-select gate 494 and reset gate 496 to improve random telegraph noise (RTS) performance.

FIG. 4 illustrates transistors 402, 404, and 406 on a same side of floating diffusion region 460 (the right side as FIG. 4 is oriented). Without departing from the scope of the embodiments, transistors 402 and 404 may be on a different side of floating diffusion region 460, e.g., above, below, or the left side, and being similarly oriented and positioned with respect to additional STI structures 408 that are oriented parallel to said different side. For example, pixel-array substrate 490 may include said additional STI structures 408, which in embodiments are oriented parallel to direction B1 and located above or below floating diffusion region 460.

FIG. 4 illustrates a shared pixel cell where multiple photodiodes, e.g., four photodiodes, share the following elements: floating diffusion region 460, source-follower transistor 402, row-select transistor 404, and reset transistor 406. Each photodiode 440 of a pixel cell 400 transfers photo-generated charges to floating diffusion region 460.

Semiconductor substrate 410 has front surface 419 and a back surface 411 (not included in FIG. 4) there opposite. Front surface 419 is an example of front substrate surface 219. FIG. 4 is shown from the perspective of viewing through front surface 419, where front surface 419 may cover one or more of the components shown in FIG. 4. Adjacent trenches 420 and 430 are separated by a distance 455 on front surface 419. In embodiments, distance 455 is between 0.03 micrometers and 0.3 micrometers. In embodiments, distance 455 is between 0.12 micrometers and 0.30 micrometers. Trenches 420 and 430 have a cross-sectional shape in the x-y plane, illustrated as being square in FIG. 4. In embodiments, the cross-sectional shape is other than square, such as circular, elliptical, rectangular, or more generally polygonal.

FIG. 4 denotes cross-sectional planes 6-6' and 7-7', each of which is parallel to the x-z plane. Cross-sectional plane 6 intersects photodiode 440, floating diffusion region 460, and trench 420 therebetween. Cross-sectional plane 7 intersects photodiode 440, floating diffusion region 460, and deep trench 430 therebetween. In embodiments, each of cross-sectional planes 6-6' and 7-7' intersects at shallow trench 420 and a deep trench 430 on opposite sides of floating diffusion region 460, as illustrated in FIG. 4. In other embodiments, cross-sectional plane 6-6' intersects two shallow trenches 420 on opposite sides of floating diffusion region 460, and cross-sectional plane 7-7' intersects two deep trenches 430 on opposite sides of floating diffusion region 460.

In embodiments, pixel-array substrate 490 includes pixel cells 400(1-k), where k is a positive integer less than or equal to four. In the embodiment of FIG. 4, pixel cells 400(k) form a two-by-two pixel array. Each pixel cell 400(k) includes photodiode 440, a shallow trench 420, and a deep trench 430. Floating diffusion region 460 is common to each of pixel cells 400(1-4). Pixel cell 400 is an example of pixel 212, FIG. 2. Within a pixel cell 400, each of shallow trench 420 and deep trench 430 is between photodiode 440 and floating diffusion region 460 in either of direction A1 (for pixel cells 400(1, 2)) or direction A2 (for pixel cells 400(3, 4)). In pixel cells 400(1, 2) shallow trench 420 is laterally displaced from deep trench 430 in direction A2. In pixel cells 400(3, 4) shallow trench 420 is laterally displaced from deep trench 430 in direction A1.

Figure 9:
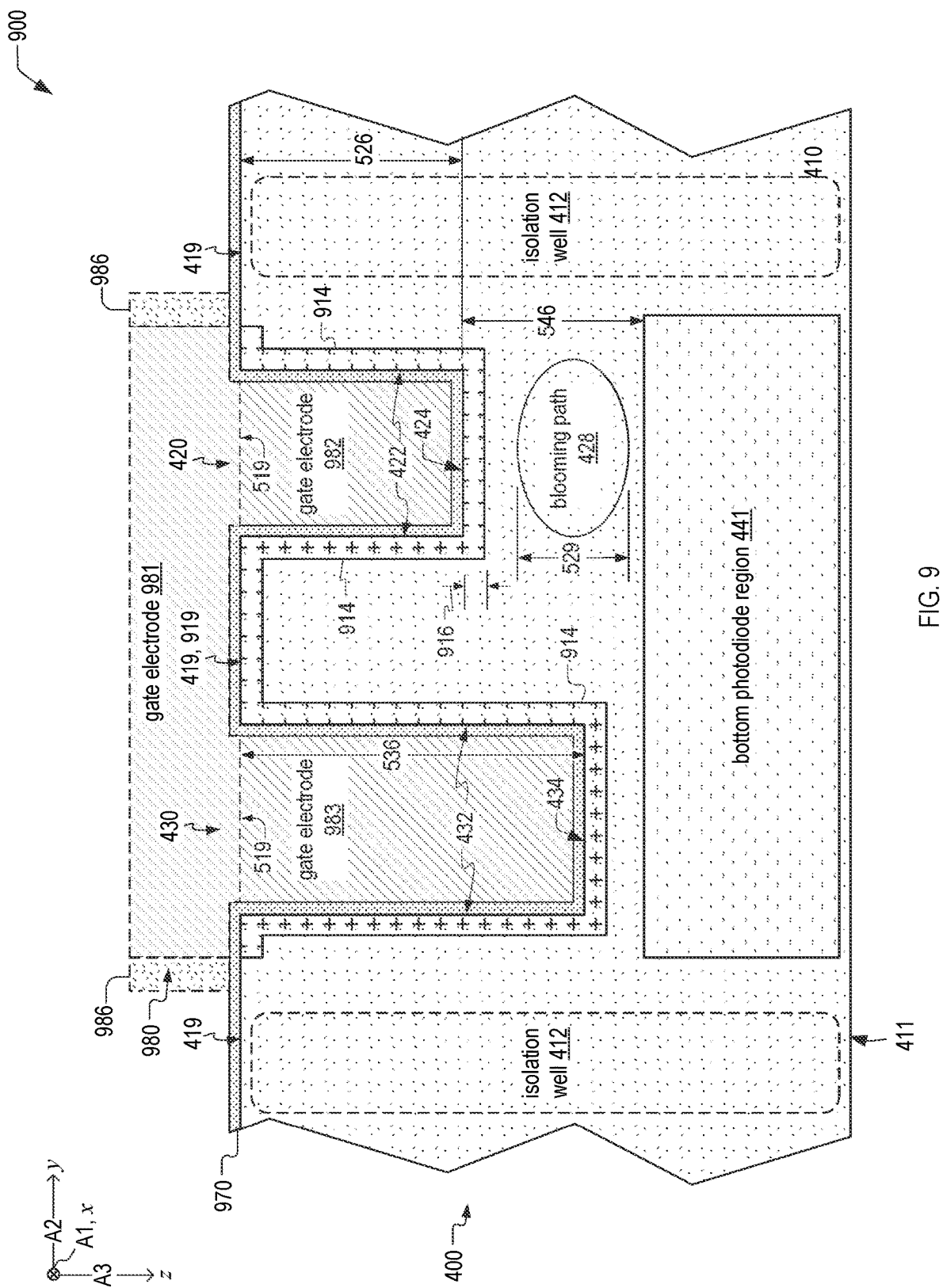
FIGS. 9-11 are respective a cross-sectional schematics of a pixel cell, an example of the pixel cell of FIGS. 4-7 with the addition of a gate and a gate dielectric layer.

In embodiments, pixel-array substrate 490 includes vertically-oriented gates filling each of trenches 420 and 430, and planar gates 481(1-4) electrically connecting the respective pair of vertically-oriented gates therebeneath. In embodiments, each planar gate 481 and the vertically-oriented gates therebeneath form a single transfer gate. For clarity of illustration, FIG. 4 does not illustrate the vertically-oriented gates. FIG. 9 illustrates gate electrodes 982 and 983, each of which are examples of said vertically-oriented gates. In the horizontal plane, each planar gate 481 is tapered toward floating diffusion region 460, that is, its distal end, located further from floating diffusion region 460, is wider than its proximal end, located closer to diffusion region 460. This tapered shape, which maybe trapezoidal as illustrated in FIG. 4, facilitates charge transfer from photodiode 440 while reducing parasitic capacitance between planar gate 481 and floating diffusion region 460.

Herein, an element in the figures denoted by a reference numeral suffixed by a parenthetical numeral is an example of the element indicated by the reference numeral. Accordingly, and unless otherwise specified, a relationship between two elements with a suffix (m) also applies for those two elements with suffix (n≠m), where m and n are positive integers. While the following description refers to elements with parenthetical numeral (1), it may also apply to at least one of parenthetical numerals (2), (3), and (4). Attributes ascribed to pixel cell 400(1) or any elements thereof may also be respectively ascribed to one or more pixel cells 400(2-4) and any elements thereof.

Figure 5:
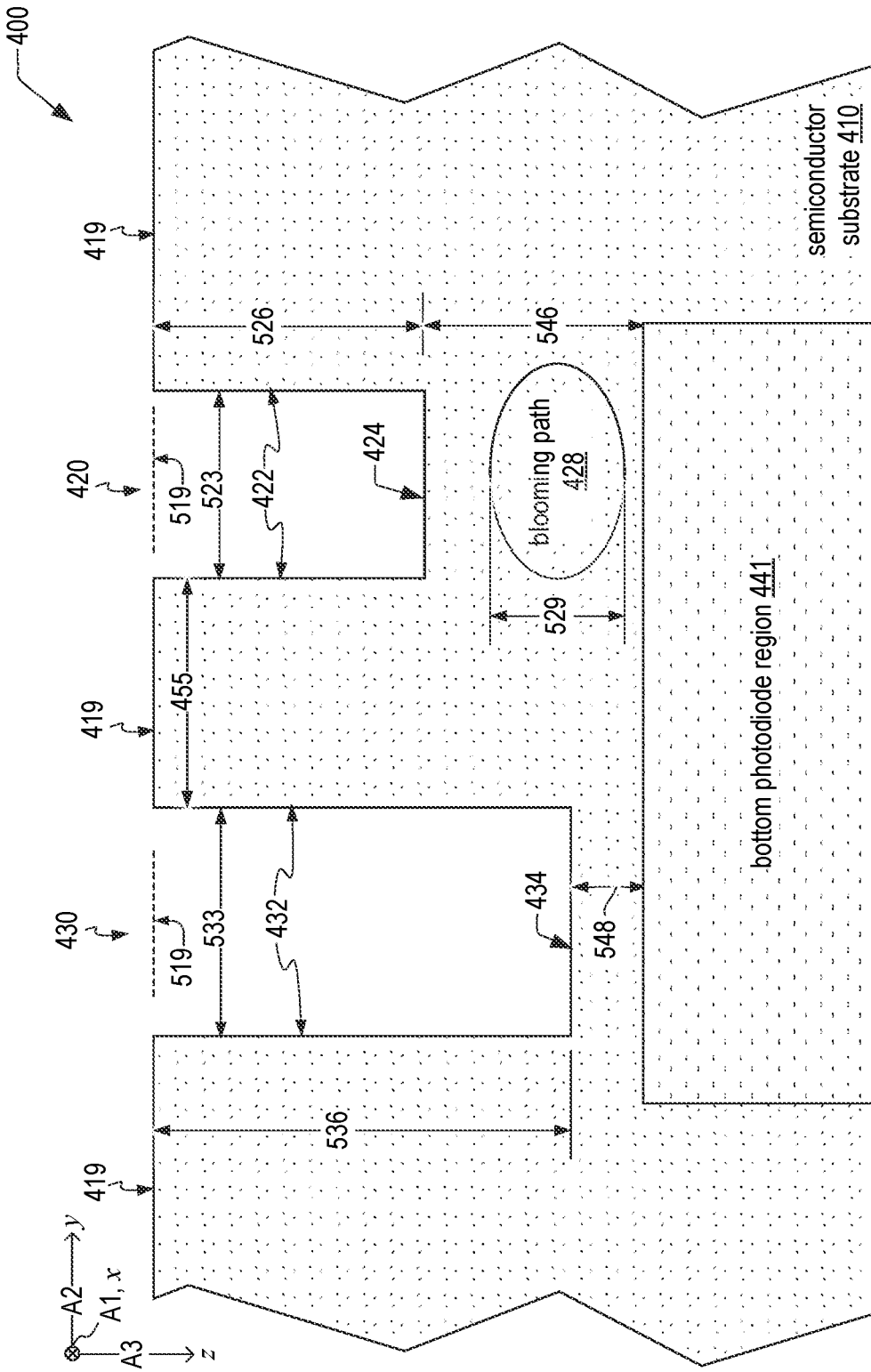
FIGS. 5, 6, and 7 are respective cross-sectional views of a pixel cell of FIG. 4, in embodiments.
Figure 6:
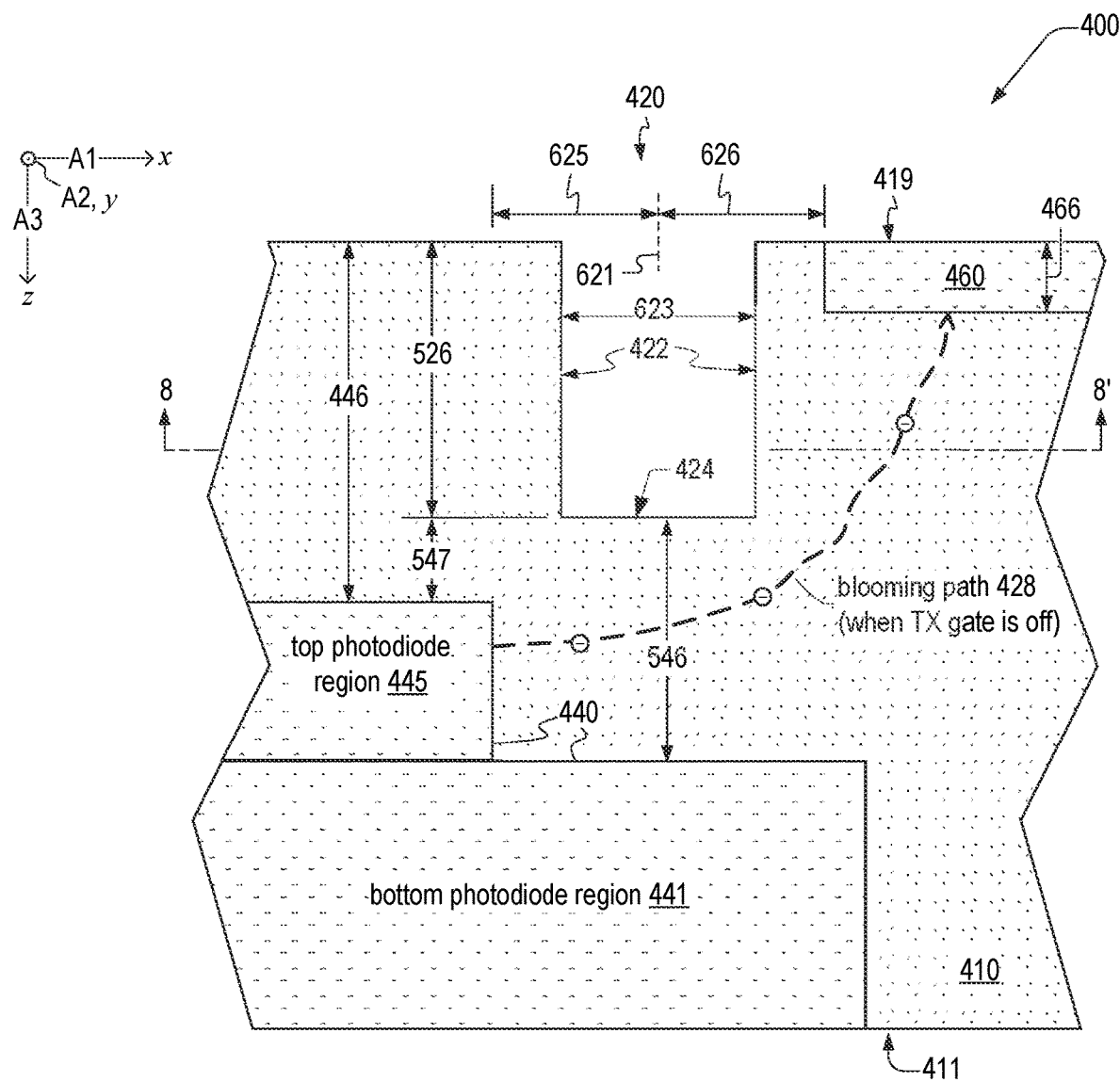
Figure 7:
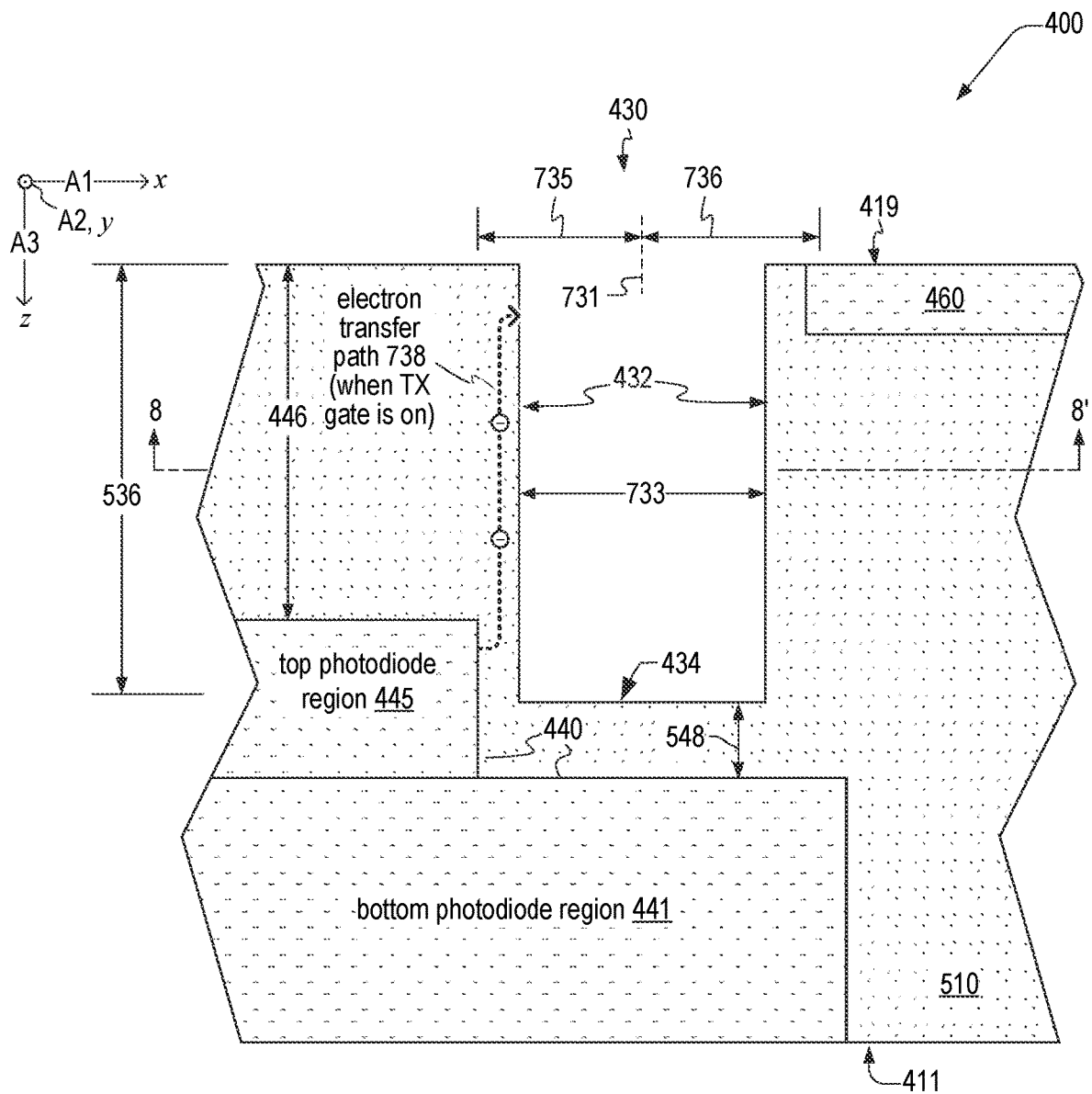

FIGS. 5, 6, and 7 are respective cross-sectional views of pixel cell 400 in cross-sectional planes 5-5', 6-6', and 7-7' of FIG. 4. FIGS. 5-7 are best viewed together in the following description.

Pixel cell 400 includes part of semiconductor substrate 410 and, formed therein, photodiode 440 and floating diffusion region 460. Semiconductor substrate 410 includes, between surfaces 411 and 419, a sidewall surfaces 422 and 432, and bottom surfaces 424 and 434. Sidewall surface 422 and 424 define shallow trench 420, which has a depth 526 with respect to front surface 419. Sidewall surface 432 and bottom surface 434 define deep trench 430, which has a depth 536 with respect to front surface 419.

FIG. 5 denotes a plane 519 that includes front surface 419 and spans between opposing regions of sidewall surface 422 and opposing regions of sidewall surface 432. Depth 526's being with respect to front surface 419 means that depth 526 is a vertical distance between bottom surface 424 and plane 519. Similarly, depth 536's being with respect to front surface 419 means that depth 536 is a vertical distance between bottom surface 434 and plane 519.

Photodiode 440 includes photodiode bottom photodiode region 441 and top bottom photodiode region 445. In embodiments, at least part of each of bottom surface 424 and bottom surface 434 is above bottom photodiode region 441, as illustrated in FIGS. 5-7. In respective cross-sectional planes parallel to the x-z plane, part of top photodiode region 445 is adjacent to each of trenches 420 and 430.

Figure 10:
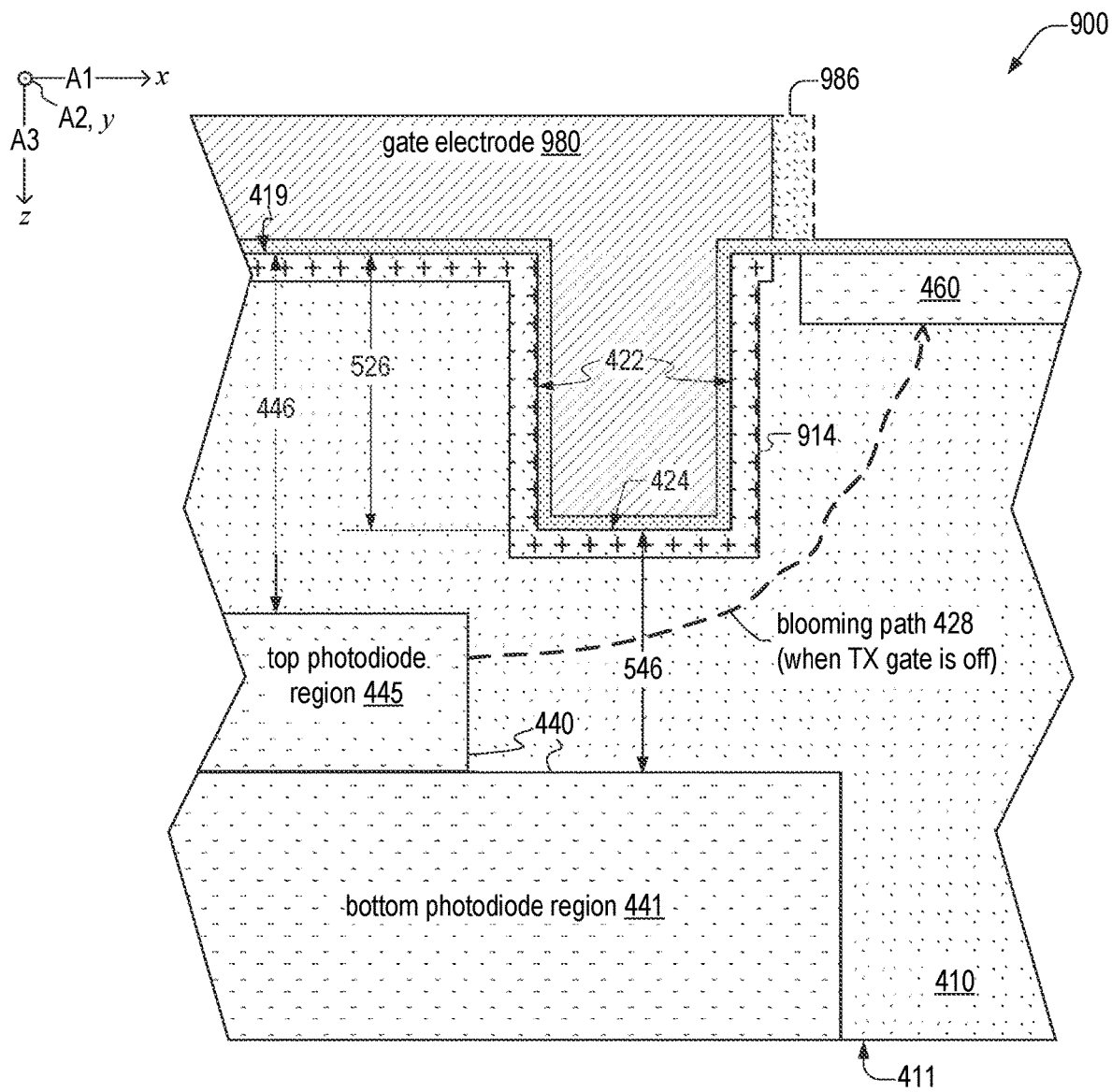
Figure 11:
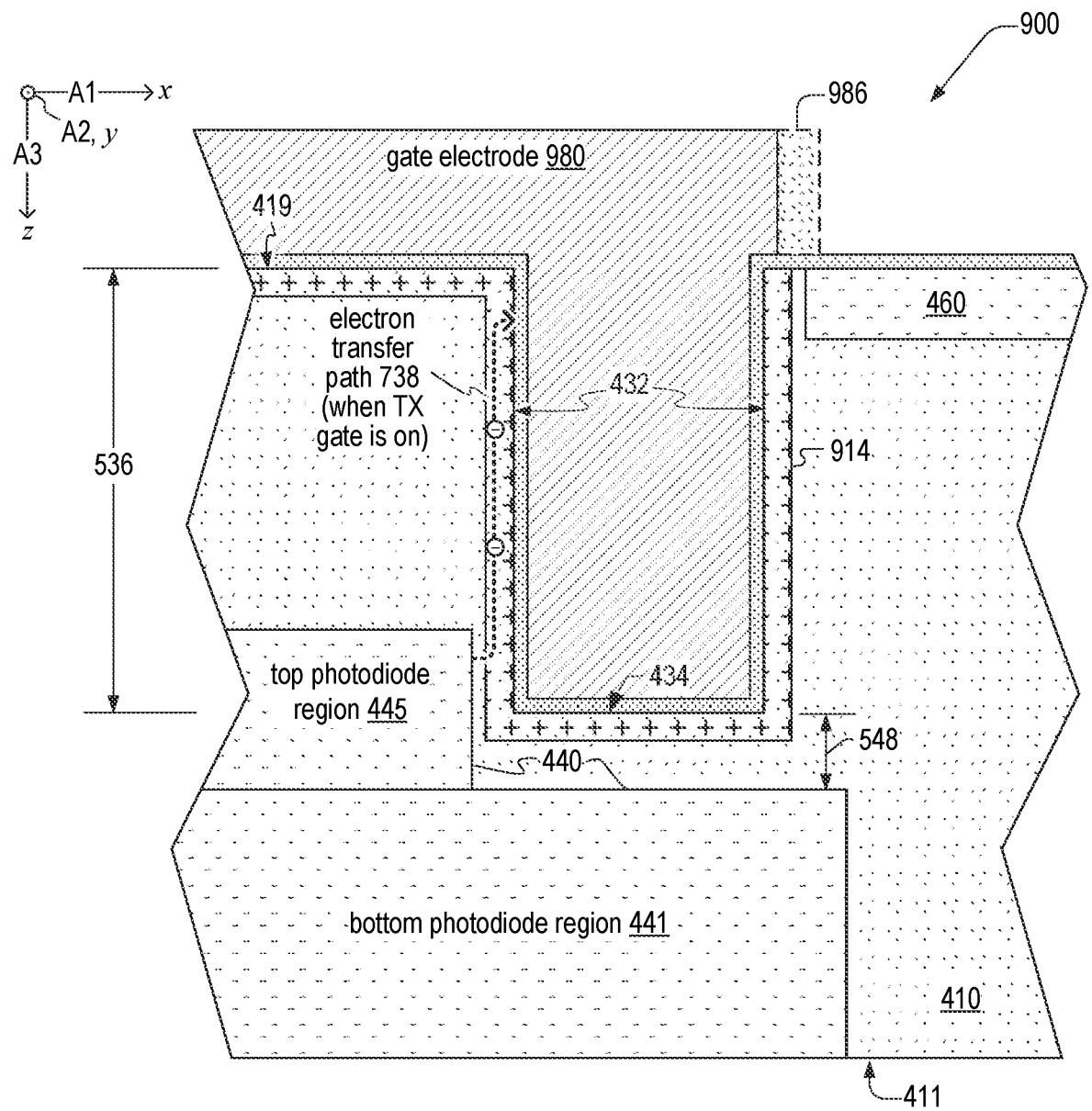

In embodiments, pixel cell 400 includes a transfer gate that includes a vertical transfer gate that fills trenches 420 and 430, for example, transfer gate 980 illustrated in FIGS. 9-11. When the transfer is on, e.g., has a positive biasing voltage applied thereto during charge transfer, electron transfer paths form between photodiode region 441 and the vertical transfer gate. FIG. 7 illustrates an electron transfer path 738 formed through conduction channels of the vertical transfer gate e.g., between respective trenches 420 and 430. Depth 526 is less than depth 536, which enables a blooming path 428 to form between photodiode region 441 and floating diffusion region 460 when negative biasing voltage is applied to the transfer gate to turn it off, for example during integration period. FIGS. 5 and 6 schematically illustrate blooming path 428.

Photoelectrons in blooming path 428 travel at least in part in direction A1 toward floating diffusion region 460. In embodiments, at least one of the following apply, each of which is conducive to enable blooming path 428: (a) depth 536 exceeds depth 526 by at least eighty nanometers, (b) depth 526 is between 0.15 micrometers and 0.35 micrometers, and (c) depth 536 is between 0.3 micrometers and 0.6 micrometers. Blooming path 428 prevents crosstalk between adjacent photodiodes 440 within pixel cell 400 and between photodiodes 440 of pixel cell 400 and photodiodes of the adjacent pixel cell, as described in the above Summary section. Pixel cell 400's trenches 420 and 430 accommodate dual vertical gate electrodes therein, benefits of which include improved carrier transfer and reduced electron backscattering and transfer lag.

FIG. 5 denotes distances 546 and 548 between photodiode region 441 and bottom surfaces 424 and 434, respectively. In embodiments at least one of (a) distance 546 is between 60 nm and 250 nm, and (b) distance 548 is between 30 nm and 150 nm. The aforementioned range of distance 546 enables formation of blooming path 428 distant from the shallow vertical gate in shallow trench 420, and in particular form under a hole accumulation region formed around and proximate to sidewalls 422, 434 and bottom surfaces 424, 434 when the transfer gate is turned off (e.g., biased with a negative biasing voltage). Accordingly, distance 546 exceeds a height 529 of blooming path 428 along axis A3.

In embodiments, depth 526 of shallow trench 420 is deeper than a junction depth 466 of floating diffusion region 460. The junction depth of floating diffusion region with respect to front surface 419 may range from 40 to 60 nanometers. In embodiments, depth 526 of shallow trench 420 is shallower (less than) than a depth 446 of top photodiode region 445 with respect to front surface 419, wherein depth 446 is the minimum (implanted) depth of photodiode 440. In embodiments, depth 536 of deep trench 430 exceeds depth 446 of top photodiode region 445.

In embodiments, shallow trench 420 is shallower than depth 446 of the top photodiode region 445. FIG. 6 denotes a distance 547 between bottom surface 424 of shallow trench 420 and the top photodiode region 445 along axis A3. In embodiments, and distance 547 exceeds fifteen nanometers.

Trenches 420 and 430 have respective widths 523 and 533, shown in FIG. 5, and respective lengths 623 and 733 shown in FIGS. 6 and 7 respectively. In embodiments, width 523 of shallow trench 420 and width 533 of deep trench are substantially the same. In embodiments, at each of plurality of depths (for example, all depths), with respect to front surface 419 that are less than depth 526, at least one of (a) width 523 of shallow trench 420 is less than width 533 of deep trench 430, and (b) length 623 of shallow trench 420 is less than length 733 of deep trench 430. In embodiments, at least one of the following ratios is between 0.5 and 0.8: a ratio of width 523 of shallow trench 420 to width 533 of deep trench 430 and a ratio of length 623 of shallow trench 420 to length 733 of deep trench 430. Each of (i) width 533's exceeding width 523 and (ii) length 733's exceeding length 623 enables formation of deep trench 430 and shallow trench 420 in a single lithographic etching step, as described below in FIGS. 12, 13, and 15. In embodiments, at least one of (a) the depth-to-width aspect ratio and (b) the depth-to-length aspect ratio of shallow trench 420 exceeds that of deep trench 430, for example, by up to fifteen percent. In embodiments, at least one of (i) width 523 equals width 533 and (b) length 623 equals length 733.

In embodiments, each of shallow trench 420 and deep trench 430 is centered between (equidistant from) top photodiode region 445 and floating diffusion region 460. Decentering trenches 420 and 430 has advantages. Positioning shallow trench 420 closer to floating diffusion region 460 increases the efficacy of blooming path 428, while positioning deep trench 430 closer to top photodiode region 445 facilitates charge transfer.

In direction A1, trenches 420 and 430 have a respective center planes 621 and 731, as illustrated in FIGS. 6 and 7 respectively. In direction A1, center plane 621 is separated from top photodiode region 445 and floating diffusion region 460 by distance 625 and distance 626 respectively. In direction A1, center plane 731 is separated from top photodiode region 445 and floating diffusion region 460 by distance 735 and distance 736 respectively. In embodiments, at least one of (a) distances 625 and 626 are equal, and (b) distances 735 and 736 are equal. In embodiments, distance 626 is less than at least one of distance 625 and distance 736. In embodiments, distance 735 is less than at least one of distance 736 and distance 625.

Figure 8:
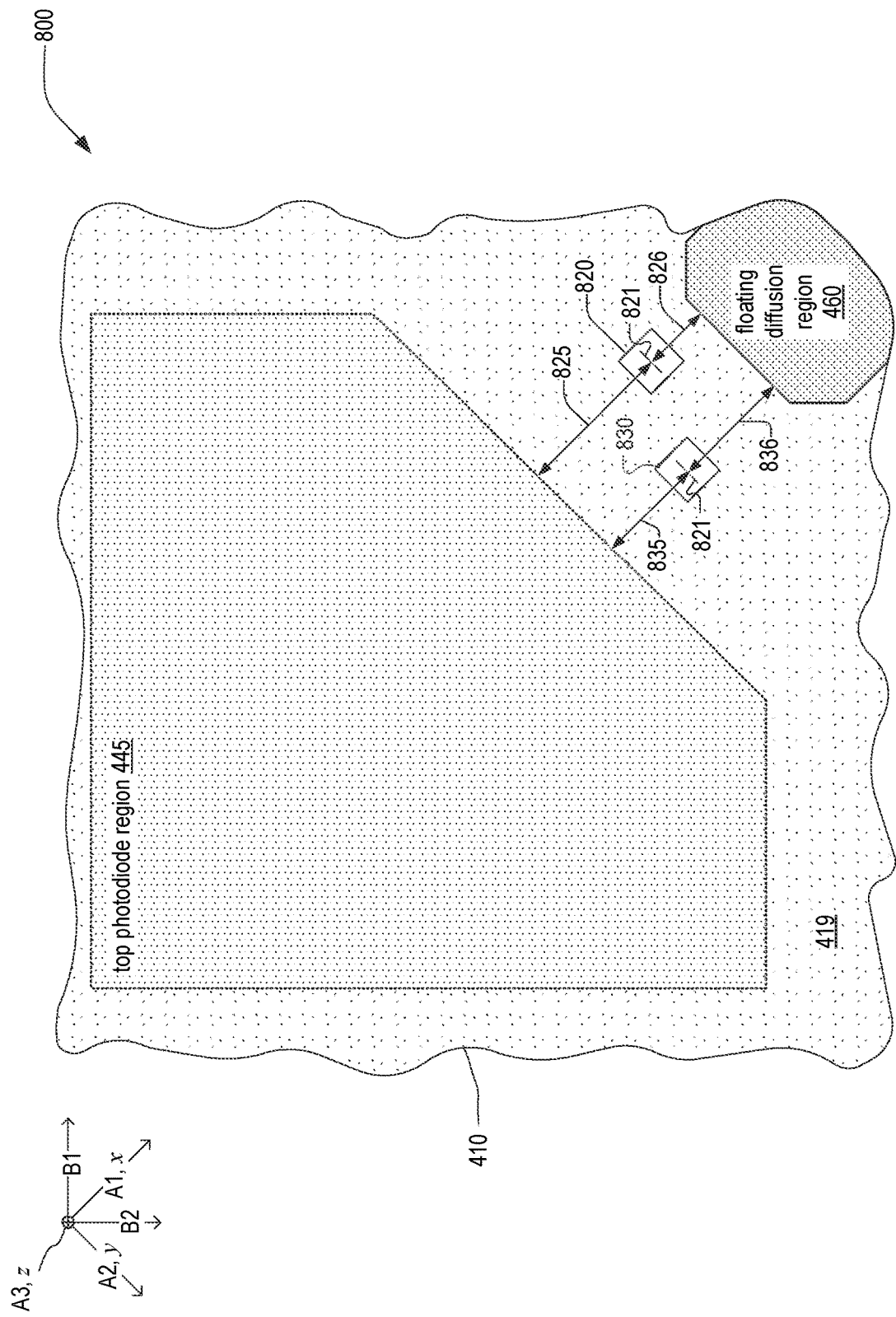
FIG. 8 is a cross-sectional view of a pixel cell, which is an example of the pixel cells of FIGS. 4-7.

FIG. 8 is a cross-sectional view of a pixel cell 800 in cross-sectional plane 8-8' shown in FIGS. 6 and 7. Pixel cell 800 is an example of pixel cell 400, and includes a shallow trench 820 and a deep trench 830, which are respective examples of shallow trench 420 and deep trench 430. Shallow trench 820 and a deep trench 830 have respective center planes 821 and 831, which are respective examples of center planes 621 and 731. FIG. 8 denotes distances 825, 826, 835, and 836, which are respective examples of distances 625, 626, 735, and 736. In embodiments, distance 826 is less than at least one of distance 825 and distance 836. In embodiments, distance 835 is less than at least one of distance 836 and distance 825.

FIGS. 9-11 are respective a cross-sectional schematics of a pixel cell 900, which is pixel cell 400 with the addition of a transfer gate 980 and a gate dielectric layer 970. Transfer gate 980 includes vertical gate electrodes 982 and 983 that fill shallow trench 420 and deep trench 430 respectively. Vertical gate electrode 982 is between bottom surface 424 and plane 519. Vertical gate electrode 983 is between bottom surface 434 and plane 519.

Gate dielectric layer 970 lines trenches 420 and 430, such that part of gate dielectric layer 970 is located between vertical gate electrode 982 and surfaces 422 and 424, and part of gate dielectric layer 970 is located between vertical gate electrode 983 and surfaces 432 and 434. Front surface 419 includes an inter-trench region 919 between trenches 420 and 430. Part of gate dielectric layer 970 is on inter-trench region 919 between trenches 420 and 430.

In embodiments, transfer gate 980 also includes a planar gate electrode 981 located above inter-trench region 919 and plane 519 and electrically coupled to each of vertical gate electrode 982 and 983. In embodiments, each of gate electrodes 981-983 are respective sections of a monolithic volume of conductive material. Planar gate electrode 981 spans between trenches 420 and 430 above inter-trench region 919. Planar gate electrode 981 is an example of planar gate 481, FIG. 4.

In embodiments, pixel cell 900 includes a spacer 986 next to and/or surrounding planar gate electrode 981. Spacer 986 may extend over floating diffusion region 460, as illustrated in FIGS. 10 and 11. In embodiments, spacer 986 has a top surface that is coplanar with a top surface of transfer gate 980. Spacer 986 may be a single layer or multi-layer stack and may be formed of nitride based material e.g., silicon nitride. While FIG. 9 illustrates spacer 986 as having a rectangular cross-section, spacer 986 may be of a different shape, e.g., triangular or trapezoidal, without departing from the scope of the embodiments.

In exemplary operation, during an integration period of pixel cell 900, transfer gate 980 is turned off (e.g., applied with a negative biasing voltage), one or more excess photogenerated charges can move toward floating diffusion region 460 through blooming path 428 formed between the vertical gate electrode 982 (shallow vertical gate) and bottom photodiode region 440. When transfer gate 980 is turned off (e.g., applied with negative biasing voltage), a hole accumulation region 914 is formed proximate and along the sidewalls and the bottom of vertical gate electrode 982 (shallow vertical gate), along the sidewalls and the bottom of vertical gate electrode 983 (deep vertical gate), and beneath gate electrode 981 (e.g., underneath the portion of gate electrode 981 between the vertical gate electrode 982 and the vertical gate electrode 983. Within hole accumulation region 914, no electron is allowed to move through. Restated, blooming path 428 is formed under hole accumulation region 914, which is formed proximate the bottom of vertical gate electrode 982 (bottom surface 424) during integration where transfer gate 980 is turned off, allowing excess electrons to flow therethrough to floating diffusion region 460. Hole accumulation region 914 extends to a distance 916 beneath bottom surface 424. In embodiments, distance 916 is at least fifteen nanometers.

In embodiments, semiconductor substrate 410 includes an isolation well 412 surrounding trench 420, trench 430, and photodiode region 441. Isolation well 412 electrically isolates photodiode region 440 and adjacent photodiode regions in semiconductor substrate 410. Isolation well 412 is a doped region within semiconductor substrate 410. The doping polarity of isolation well 412 may be opposite that of photodiode region 441. In embodiments, isolation well 412 is a p-doped isolation well.

Figure 12:
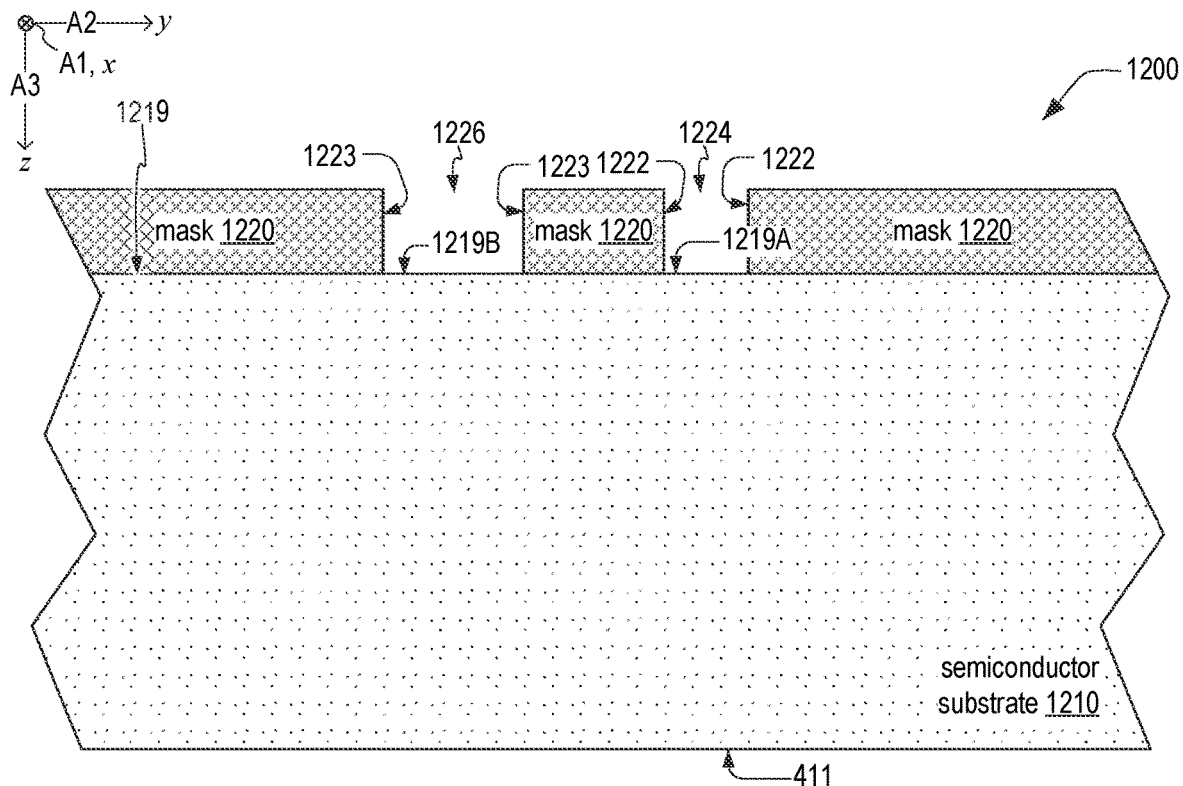
FIG. 12 is a schematic cross-sectional view of a masked substrate, which is a precursor to the pixel-array substrate of FIG. 4, in an embodiment.

FIG. 12 is a schematic cross-sectional view of a masked substrate 1200, which includes a lithographic mask 1220 on a semiconductor substrate 1210. Semiconductor substrate 1210 is a precursor to semiconductor substrate 410 of FIGS. 4-11, and has a back surface 411 and a front surface 1219. Lithographic mask 1220 includes interior sidewalls 1222 and 1223 that define respective apertures 1224 and 1226, which expose respective regions 1219A and 1219B of front surface 1219. In embodiments, aperture 1226 is wider than aperture 1224 is in at least one of directions A1 and A2 such that trenches having different depths can be formed using one lithographic mask by utilizing etch loading effect. Lithographic mask 1220 may be formed of a nitride material.

Figure 13:
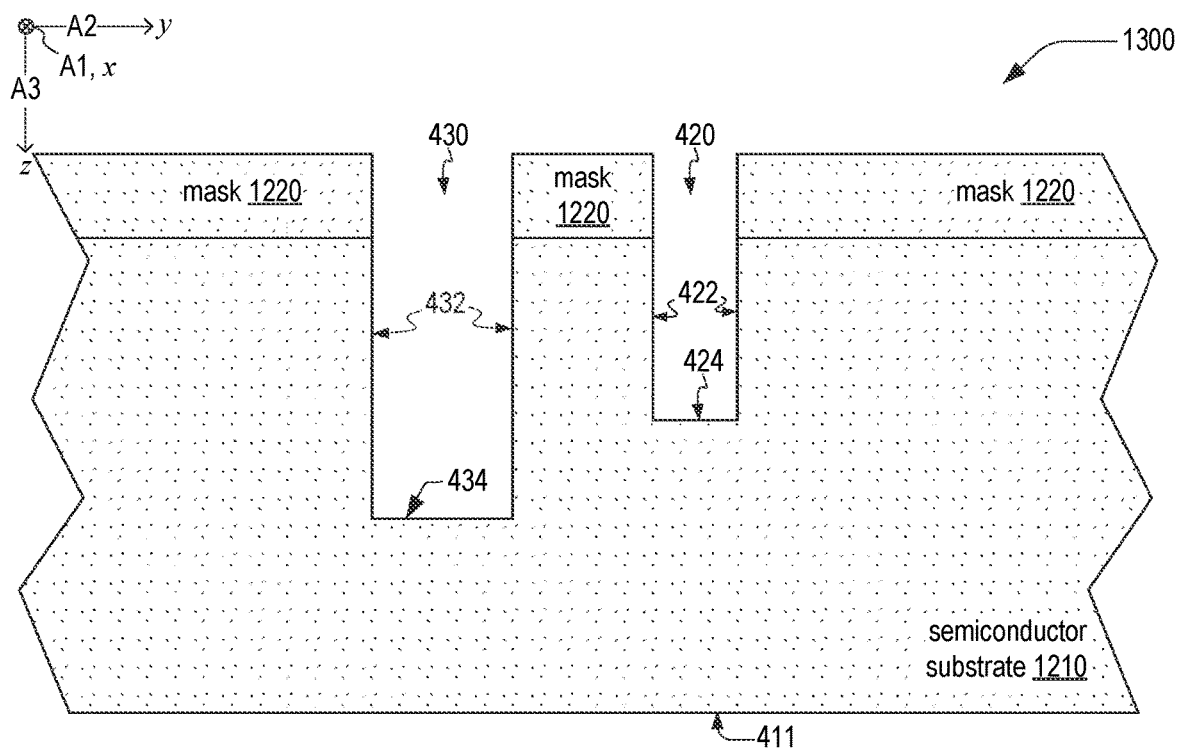
FIG. 13 is a schematic cross-sectional view of a masked substrate, which is the masked substrate of FIG. 12 after etching, in an embodiment.

FIG. 13 is a schematic cross-sectional view of a masked substrate 1300, which is masked substrate 1200 after etching, through lithographic mask 1220, trenches 420 and 430 into semiconductor substrate 1210. FIG. 14 is a schematic cross-sectional view of a pixel cell 1400, which is masked substrate 1300 after removal of lithographic mask 1220 and formation of isolation well 412 and photodiode region 441 in semiconductor substrate 1210, which yields a semiconductor substrate 1410. Semiconductor substrate 1410 is an example of semiconductor substrate 410.

FIG. 15 is a flowchart illustrating a method 1500 for fabricating a pixel cell, such as pixel cell 400. Method 1500 includes step 1510 and, in embodiments, at least one of steps 1520, 1530, 1540, and 1550.

Step 1510 includes simultaneously etching (i) a first region of a substrate exposed by a small aperture of an apertured mask located on a surface of the substrate, and (ii) a second region of the substrate exposed by a large aperture of the apertured mask. In a direction parallel to the surface, a width of the large aperture in a first direction exceeds a width of the small aperture in the first direction. In an example of step 1510, regions 1219A and 1219B of semiconductor substrate 1210 are simultaneously etched.

In embodiments, step 1510 includes a step 1512, in which the first and second regions are etched with the same exposure dose. In an example of step 1512, regions 1219A and 1219B are etched with the same exposure dose.

In embodiments, step 1510 yields shallow trench 420 and deep trench 430, which has a greater depth than shallow trench 420 as illustrated by masked substrate 1300, FIG. 13 and semiconductor substrate 1410, FIG. 14. Step 1520 includes lining the shallow trench, the deep trench, and an inter-trench region of the surface therebetween with a dielectric layer. In an example of step 1520, shallow trench 420, deep trench 430 and inter-trench region 919 therebetween are lined with gate dielectric layer 970, FIG. 9.

Step 1530 includes filling the shallow trench and the deep trench with a conductive material that spans between the shallow trench and the deep trench via the inter-trench region. In an example of step 1530, shallow trench 420 and deep trench 430 are filled with vertical gate electrodes 982 and 983 respectively to yield pixel cell 900, in which vertical gate electrodes 982 and 983 are part of transfer gate 980 that includes planar gate electrode 981. In embodiments, planar gate electrode 981 is formed, as part of step 1530 for example, on semiconductor substrate 410 via deposition of conductive material and subsequent etching of the deposited conductive material. Planar gate electrode 981 is an example of planar gate electrode 481. In embodiments, the conductive material includes at least one of polysilicon and a metal.

Step 1540 includes forming a single photodiode region, at least part of which is located beneath each of the deep trench and the shallow trench. In embodiments, the single photodiode region is adjacent to each of the deep trench and the shallow trench. The single photodiode region may be formed via implantation. In embodiments, the single photodiode region is implanted at a depth greater than the shallow trench. In an example of step 1540, photodiode region 441 is formed beneath each of trenches 420 and 430, as illustrated in FIG. 9.

Step 1550 includes forming an isolation well of opposite conductive type (e.g., p-type) to the single photodiode region surrounding the single photodiode region. In an example of step 1550, isolation well 412 is formed in semiconductor substrate 410 by implantation.

Figure 16:
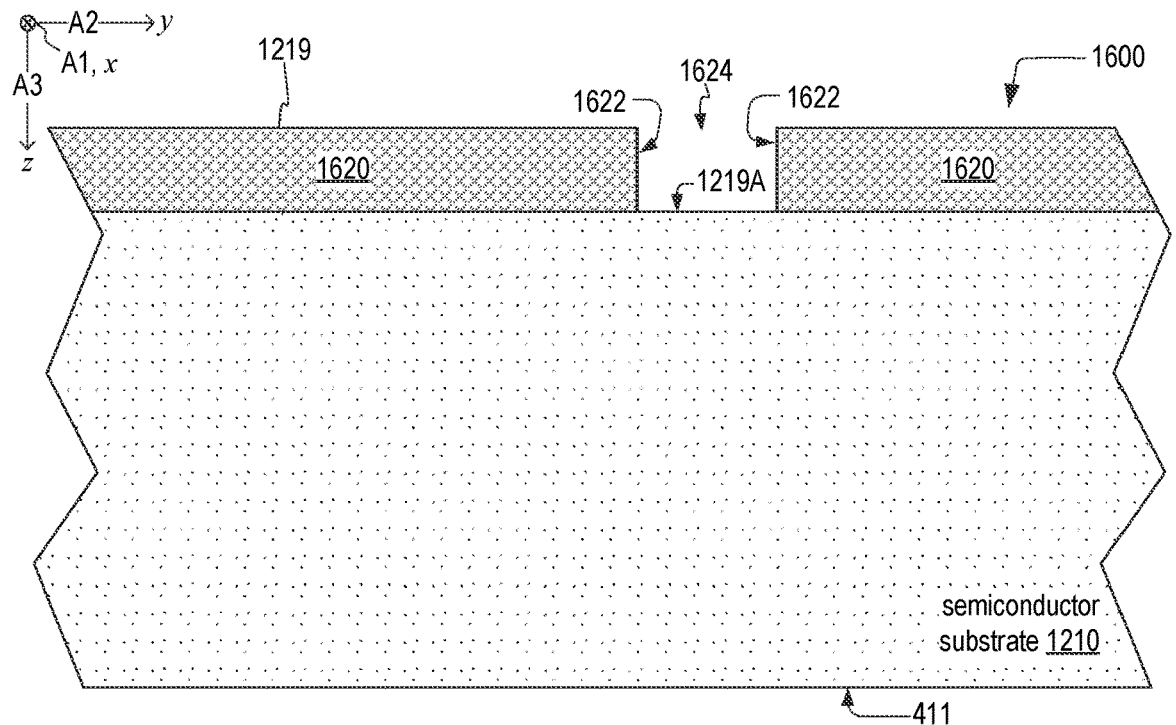
FIG. 16 is a schematic cross-sectional view of a masked substrate, which is a precursor to the pixel-array substrate of FIG. 4, in an embodiment.

FIG. 16 is a schematic cross-sectional view of a masked substrate 1600, which includes a lithographic mask 1620 on semiconductor substrate 1210. Lithographic mask 1620 includes an interior sidewall 1622 defines an aperture 1624 that exposes a region 1219A of front surface 1219. Lithographic mask 1620 may be formed of a nitride material.

Figure 17:
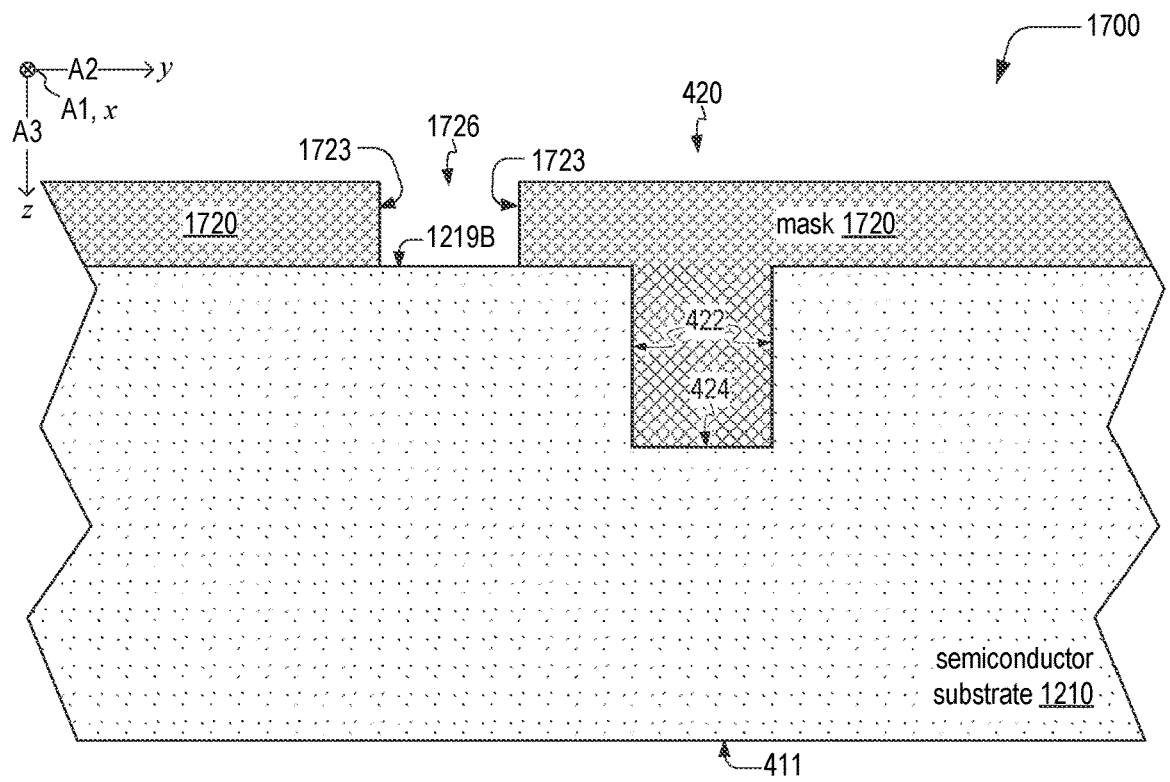
FIG. 17 is a schematic cross-sectional view of a masked substrate, which is the masked substrate of FIG. 16 after etching and forming a second mask thereon, in an embodiment.

FIG. 17 is a schematic cross-sectional view of a masked substrate 1700, which is masked substrate 1600 after etching trench 420 through lithographic mask 1620, removing remains of lithographic mask 1620, and disposing or forming a lithographic mask 1720 on front surface 1219. Lithographic mask 1720 includes an interior sidewall 1723 defines an aperture 1726 that exposes a region 1219B of front surface 1219. In embodiments, apertures 1624 and 1726 have the same width in at least one of directions A1 and A2. Semiconductor substrate 1410, FIG. 14, may be obtained from masked substrate 1700 by etching deep trench 430 through lithographic mask 1720, depositing a gate dielectric layer (not shown in FIG. 14), a conductive material (not shown in FIG. 14) and thereafter forming isolation well 412, bottom photodiode region 441, and top photodiode region 445 (not shown in FIG. 14) in semiconductor substrate 1210. In embodiments, etching substrate through lithographic masks 1620, 1720 result in shallow trench 420 and deep trench 430 having substantially same widths.

Combinations of Features

Features described above as well as those claimed below may be combined in various ways without departing from the scope hereof. The following enumerated examples illustrate some possible, non-limiting combinations.

(A1) An uneven-trench pixel cell includes a semiconductor substrate that includes a floating diffusion region, a photodiode region, and, between a front surface and a back surface opposing the front surface of the semiconductor substrate: a first sidewall surface, a shallow bottom surface, a second sidewall surface, and a deep bottom surface. The first sidewall surface and a shallow bottom surface define a shallow trench, located between the floating diffusion region and the photodiode region, that extends into the semiconductor substrate from the front surface. A distance between the shallow bottom surface and the front surface defines a shallow depth of the shallow trench. The shallow depth exceeds a junction depth of the floating diffusion region. The second sidewall surface and a deep bottom surface define a deep trench, located between the floating diffusion region and the photodiode region, that extends into the semiconductor substrate from the front surface. A distance between the deep bottom surface and the front surface defines a deep depth, of the deep trench, that exceeds the shallow depth.

(A2) In embodiments of pixel cell (A1), the shallow trench and the deep trench are located between the floating diffusion region and the photodiode region in a first direction, the shallow trench being laterally displaced from the deep trench in a second direction that is perpendicular to the first direction.

(A3) In embodiments of pixel cell (A2), in the first direction, at least one of (i) the shallow trench is closer to the floating diffusion region than to the photodiode region and (ii) a distance between the shallow trench and the floating diffusion region is less than a distance between the deep trench and the floating diffusion region.

(A4) In embodiments of either one of pixel cells (A2) and (A3), in the first direction, at least one of (i) the deep trench is closer to the photodiode region than from the floating diffusion region and (ii) a distance between the deep trench and the photodiode region is less than a distance between the shallow trench and the photodiode region.

(A5) In embodiments of any one of pixel cells (A1)-(A4), the deep depth exceeds the shallow depth by at least eighty nanometers.

(A6) In embodiments of any one of pixel cells (A1)-(A5), the shallow depth is between 0.15 micrometers and 0.35 micrometers.

(A7) In embodiments of any one of pixel cells (A1)-(A6), the deep depth is between 0.3 micrometers and 0.6 micrometers.

(A8) In embodiments of any one of pixel cells (A1)-(A7), the shallow trench is narrower than the deep trench at each of a plurality of depths with respect to the front surface that are less than the shallow depth.

(A9) In embodiments of pixel cell (A8), a ratio of a shallow-trench width of the shallow trench to a deep-trench width of the deep trench is between 0.5 and 0.8.

(A10) In embodiments of any one of pixel cells (A1)-(A9), at least part of each of the shallow bottom surface and the deep bottom surface is above part of the photodiode region.

(A11) In embodiments of any one of pixel cells (A1)-(A10), a first aspect ratio of the shallow trench exceeds a second aspect ratio of the deep trench.

(A12) In embodiments of pixel cell (A11), the first aspect ratio divided by the second aspect ratio is less than or equal to 1.15.

(A13) Embodiments of any one of pixel cells (A1)-(A12) further include a gate electrode and a dielectric layer. The gate electrode is on the front surface and fills each of the shallow trench and the deep trench. The gate dielectric layer is located between the gate electrode and each of (i) the first and second sidewall surfaces, (ii) the shallow bottom surface, (iii) the deep bottom surface, and (iv) a region of the front surface between the shallow trench and the deep trench.

(A14) In embodiments of any one of pixel cells (A1)-(A13), the shallow depth is less than a minimum depth of the photodiode region with respect to the front surface.

(B1) A pixel cell includes a semiconductor substrate and a transfer gate. The semiconductor substrate includes a floating diffusion region, a photodiode region, and a front surface. The transfer gate is disposed on the semiconductor substrate, couples the photodiode region to the floating diffusion region, and includes: a first vertical gate electrode extending to a first depth from the front surface into the semiconductor substrate; and a second vertical gate electrode extending a second depth from the front surface into the semiconductor substrate. The second depth exceeds the first depth. The first depth exceeds a junction depth of the floating diffusion region.

(B2) In embodiments of pixel cell (B1) the first vertical gate electrode and the second vertical gate electrode are located between the floating diffusion region and the photodiode region in a first direction. The first vertical gate electrode is laterally displaced from the second vertical gate electrode in a second direction that is perpendicular to the first direction.

(B3) In embodiments of pixel cell (B2), in the first direction, at least one of (i) the first vertical gate electrode is closer to the floating diffusion region than to the photodiode region and (ii) a distance between the first vertical gate electrode and the floating diffusion region is less than a distance between the second vertical gate electrode and the floating diffusion region.

(B4) In embodiments of either one of pixel cells (B2) and (B3), in the first direction, at least one of (i) the second vertical gate electrode is closer to the photodiode region than from the floating diffusion region and (ii) a distance between the second vertical gate electrode and the photodiode region is less than a distance between the first vertical gate and the photodiode region (B5) In embodiments of any one of pixel cells (B1)-(B4), the transfer gate further includes a planar gate electrode disposed on the front surface, and electrically coupled to the first and second vertical gate electrodes.

(B6) In embodiments of any one of pixel cells (B4)-(B5), the first vertical gate electrode extends from the planar gate electrode to the first depth, and the second vertical gate electrode extends from the planar gate electrode to the second depth.

(B7) In embodiments of any one of pixel cells (B1)-(B6), the first depth is less than a minimum depth of the photodiode region with respect to the front surface.

(C1) A method for fabricating a pixel cell includes simultaneously etching (i) a first region of a substrate exposed by a small aperture of an apertured mask located on a surface of the substrate, and (ii) a second region of the substrate exposed by a large aperture of the apertured mask. In a direction parallel to the surface, a width of the large aperture in a first direction exceeds a width of the small aperture in the first direction.

(C2) In embodiments of method (C1), etching includes etching the first region and the second region with a same exposure dose.

(C3) In embodiments of method (C2), etching the first region and the second region yields a shallow trench and a deep trench respectively. In such embodiments, the method further includes: (a) lining the shallow trench, the deep trench, and an inter-trench region of the surface therebetween with a dielectric layer; and (b) filling the shallow trench and the deep trench with a conductive material that spans between the shallow trench and the deep trench via the inter-trench region.

(C4) Embodiments method (C3) further includes forming a single photodiode region, at least part of which is located beneath each of the deep trench and the shallow trench.

(C5) Embodiments of method (C4) further include forming an isolation well surrounding the single photodiode region, the isolation well and the single photodiode regions being of opposite conductive types.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. An uneven-trench pixel cell comprising:
a semiconductor substrate that includes a floating diffusion region and a photodiode region; and, between a front surface and a back surface opposing the front surface of the semiconductor substrate:
(i) a first sidewall surface and a shallow bottom surface defining a shallow trench located between the floating diffusion region and the photodiode region and extending into the semiconductor substrate from the front surface, a distance between the shallow bottom surface and the front surface defining a shallow depth of the shallow trench that exceeds a junction depth of the floating diffusion region relative to the front surface; and
(ii) a second sidewall surface and a deep bottom surface defining a deep trench located between the floating diffusion region and the photodiode region and extending into the semiconductor substrate from the front surface, a distance between the deep bottom surface and the front surface defining a deep depth, of the deep trench, that exceeds the shallow depth;
the distance defining the shallow depth being in a depth direction, the shallow trench and the deep trench being located between the floating diffusion region and the photodiode region in a first direction, the shallow trench being laterally displaced from the deep trench in a second direction that is perpendicular to the first direction, each of the first direction and the second direction being perpendicular to the depth direction.

2. The pixel cell of claim 1, in the first direction, at least one of (i) the shallow trench being closer to the floating diffusion region than to the photodiode region and (ii) a distance between the shallow trench and the floating diffusion region being less than a distance between the deep trench and the floating diffusion region.

3. The pixel cell of claim 1, in the first direction, at least one of (i) the deep trench being closer to the photodiode region than from the floating diffusion region and (ii) a distance between the deep trench and the photodiode region being less than a distance between the shallow trench and the photodiode region.

4. The pixel cell of claim 1, the deep depth exceeding the shallow depth by at least eighty nanometers.

5. The pixel cell of claim 1, the shallow depth being between 0.15 micrometers and 0.35 micrometers.

6. The pixel cell of claim 1, the deep depth being between 0.3 micrometers and 0.6 micrometers.

7. The pixel cell of claim 1, the shallow trench being narrower than the deep trench at each of a plurality of depths with respect to the front surface that are less than the shallow depth.

8. The pixel cell of claim 7, a ratio of a shallow-trench width of the shallow trench to a deep-trench width of the deep trench being between 0.5 and 0.8.

9. The pixel cell of claim 1, at least part of each of the shallow bottom surface and the deep bottom surface being above part of the photodiode region.

10. The pixel cell of claim 1, a first aspect ratio of the shallow trench exceeding a second aspect ratio of the deep trench.

11. The pixel cell of claim 10, the first aspect ratio divided by the second aspect ratio being less than or equal to 1.15.

12. The pixel cell of claim 1, further comprising:
a gate electrode on the front surface and filling each of the shallow trench and the deep trench; and
a gate dielectric layer located between the gate electrode and each of (i) the first and the second sidewall surfaces, (ii) the shallow bottom surface, (iii) the deep bottom surface, and (iv) a region of the front surface between the shallow trench and the deep trench.

13. The pixel cell of claim 1, the shallow depth being less than a minimum depth of the photodiode region with respect to the front surface.

14. A pixel cell, comprising:
a semiconductor substrate that includes a floating diffusion region, a photodiode region, and a front surface; and a transfer gate disposed on the semiconductor substrate, coupling the photodiode region to the floating diffusion region, and including:
- a first vertical gate electrode extending to a first depth along a depth direction from the front surface into the semiconductor substrate, the first depth exceeding a junction depth of the floating diffusion region; and
- a second vertical gate electrode extending a second depth from the front surface along the depth direction into the semiconductor substrate, the second depth exceeding the first depth;

the first vertical gate electrode and the second vertical gate electrode being located between the floating diffusion region and the photodiode region in a first direction, the first vertical gate electrode being laterally displaced from the second vertical gate electrode in a second direction that is perpendicular to the first direction, each of the first direction and the second direction being perpendicular to the depth direction.

15. The pixel cell of claim 14, in the first direction, at least one of (i) the first vertical gate electrode being closer to the floating diffusion region than to the photodiode region and (ii) a distance between the first vertical gate electrode and the floating diffusion region being less than a distance between the second vertical gate electrode and the floating diffusion region.

16. The pixel cell of claim 14, in the first direction, at least one of (i) the second vertical gate electrode being closer to the photodiode region than from the floating diffusion region and (ii) a distance between the second vertical gate electrode and the photodiode region being less than a distance between the first vertical gate electrode and the photodiode region.

17. The pixel cell of claim 14, the first depth being less than a minimum depth of the photodiode region with respect to the front surface.

18. The pixel cell of claim 14, the transfer gate further including a planar gate electrode disposed on the front surface, and electrically coupled to the first and the second vertical gate electrodes.

19. The pixel cell of claim 18, the first vertical gate electrode extending from the planar gate electrode to the first depth, the second vertical gate electrode extending from the planar gate electrode to the second depth.

20. A method for fabricating a pixel cell, comprising:
simultaneously etching (i) a first region of a semiconductor substrate exposed by a small aperture of an apertured mask located on a surface of the semiconductor substrate to yield a shallow trench having a shallow bottom surface, and (ii) a second region of the semiconductor substrate exposed by a large aperture of the apertured mask to yield a deep trench having a deep bottom surface, in a direction parallel to the surface, a width of the large aperture in a first direction exceeding a width of the small aperture in the first direction;

the semiconductor substrate including a floating diffusion region and a photodiode region;

the shallow trench being located between the floating diffusion region and the photodiode region and extending into the semiconductor substrate from a front surface of the semiconductor substrate, a distance between the shallow bottom surface and the front surface defining a shallow depth of the shallow trench that exceeds a junction depth of the floating diffusion region relative to the front surface;

a deep trench located between the floating diffusion region and the photodiode region and extending into the semiconductor substrate from the front surface, a distance between the deep bottom surface and the front surface defining a deep depth, of the deep trench, that exceeds the shallow depth;

the distance defining the shallow depth being in a depth direction, the shallow trench and the deep trench being located between the floating diffusion region and the photodiode region in a first direction, the shallow trench being laterally displaced from the deep trench in a second direction that is perpendicular to the first direction, each of the first direction and the second direction being perpendicular to the depth direction.

21. The method of claim 20, said simultaneously etching comprising etching the first region and the second region with a same exposure dose.

22. The method of claim 21, said simultaneously etching the first region and the second region yielding the shallow trench and the deep trench respectively, and further comprising:
- lining the shallow trench, the deep trench, and an inter-trench region of the surface therebetween with a dielectric layer; and
- filling the shallow trench and the deep trench with a conductive material that spans between the shallow trench and the deep trench via the inter-trench region.

23. The method of claim 22, further comprising forming a single the photodiode region, at least part of which is located beneath each of the deep trench and the shallow trench.

24. The method of claim 23, further comprising forming an isolation well surrounding the photodiode region, the isolation well and the photodiode region being of opposite conductive types.

25. The pixel cell of claim 14, the first vertical gate electrode and the second vertical gate electrode are disposed between the front surface and the photodiode region in the depth direction.

* * * * *